United States Patent [19]

Bachman et al.

[11] 4,179,178

[45] Dec. 18, 1979

[54] PLUG-IN CIRCUIT CARTRIDGE WITH ELECTROSTATIC CHARGE PROTECTION

[75] Inventors: William J. Bachman, Mt. Laurel; Franklin R. Dimeo, Woodbury, both of N.J.

[73] Assignee: RCA Corporation, New York, N.Y.

[21] Appl. No.: 874,636

[22] Filed: Feb. 2, 1978

[51] Int. Cl.² .......................................... H01R 13/52
[52] U.S. Cl. ............................... 339/111; 200/51.1; 339/19; 339/150 R; 339/222
[58] Field of Search ............... 339/111, 150 R, 150 C, 339/150 T, 176 MP, 222, 19, 74 R; 200/51.1

[56] References Cited

U.S. PATENT DOCUMENTS

| | | | |
|---|---|---|---|
| 2,848,706 | 8/1958 | Besserer | 339/222 |
| 3,200,365 | 8/1965 | Carpinone | 339/111 X |
| 3,576,515 | 4/1971 | Frantz | 339/176 MP |
| 3,946,390 | 3/1976 | Alexander et al. | 200/51.1 X |
| 4,070,557 | 1/1978 | Ostapovitch | 339/19 X |

*Primary Examiner*—Roy Lake
*Assistant Examiner*—DeWalden W. Jones
*Attorney, Agent, or Firm*—Eugene M. Whitacre; William H. Meagher; Ronald H. Kurdyla

[57] ABSTRACT

A plug-in cartridge designed to mate with an external system via a connector having a plurality of external mating receptacles, and one or more external actuator pins, for engaging the cartridge. The cartridge encloses a printed circuit board with terminals arranged to receive an electrical circuit (e.g., an integrated circuit) susceptible to damage by excessive electrostatic charge. The circuit board includes a plurality of metallic contact areas conductively connected to respective terminals, extending external to the cartridge, and configured to engage the mating receptacles of the connector. The cartridge also includes a protection device comprising a plurality of conductive fingers formed from a common conductive element. The device is arranged such that, when the cartridge and connector are disengaged, the fingers contact associated ones of the contact areas whereby the contact areas and therefore the circuit terminals are connected in common (i.e., shorted) to preclude circuit damage due to electrostatic charge. When the cartridge is mated to the connector, the actuator pins contact the device to lift the fingers off the contact areas, thereby permitting the electrical circuit to operate in expected fashion.

5 Claims, 5 Drawing Figures

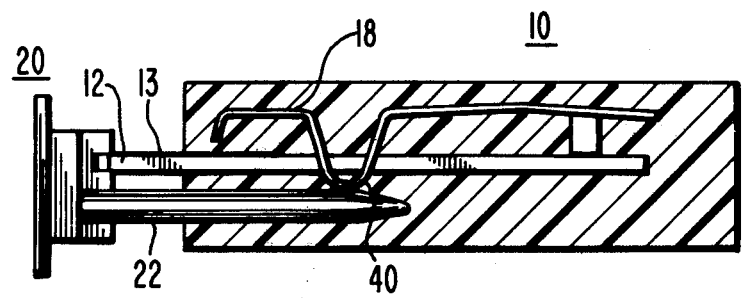
Fig. 3.
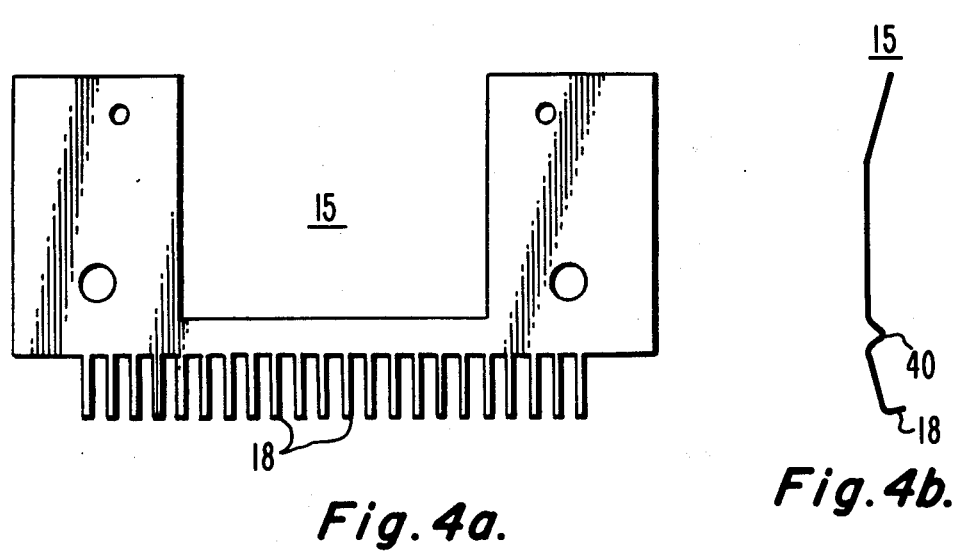
Fig. 4a.
Fig. 4b.

PLUG-IN CIRCUIT CARTRIDGE WITH ELECTROSTATIC CHARGE PROTECTION

This invention concerns a plug-in cartridge enclosing an electrical circuit such as may be used for programming the operation of an electrical system with which it is designed to operate. More specifically, the invention relates to such a cartridge including means for preventing circuit damage due to excessive electrostatic charge when being handled.

A cartridge of this type can be used, for example, in so-called "video games" apparatus. As is known, such apparatus is operatively associated with a visual display device such as kinescope of a television receiver, and includes a manually operated control unit for use by one or more operators, or "players". A control unit of this type is programmed to operate according to one or more "game" formats. One-piece cartridges containing electrical control circuitry and designed to plug into the control unit are a convenient means by which the control unit can be programmed to respond to various game formats as selected by the operator.

The programming cartridge and the control unit often include integrated circuit devices (e.g., CMOS devices) which can be damaged by excessive electrostatic charge, particularly when the cartridge is being connected and disconnected from the control unit.

It is therefore desirable to protect the circuit devices within the cartridge from electrostatic charge when the cartridge is being disconnected from the control unit. It is also desirable to protect the circuit devices within both the cartridge and the control unit when the cartridge is being connected to the control unit.

Cartridge apparatus according to the present invention includes a rigid member having means for mounting thereon an electrical circuit susceptible to damage from excessive electrostatic charge. A plurality of conductive contact areas associated with the mounting means is disposed along an edge of the rigid member. Also included is a charge protection device comprising a plurality of conductive elements formed from a common conductive member having a contact region. The rigid member with the electrical circuit and the protection device are enclosed and secured by a housing assembly. The housing assembly is configured to define an aperture through which the contact areas are externally exposed. The housing assembly also defines a receptacle configured to receive an external actuator device, when present. The conductive elements engage the contact areas in the absence of the actuator device. The contact region of the protection device is conductively engaged by the actuator device when received by the receptacle, to thereby cause the conductive elements to disengage from the contact areas.

In the drawing:

FIG. 3 illustrates a cross-sectional view of a portion of the cartridge and connector assembly; and FIGS. 4a and 4b respectively show top and profile views of the protection device.

Figure 1:
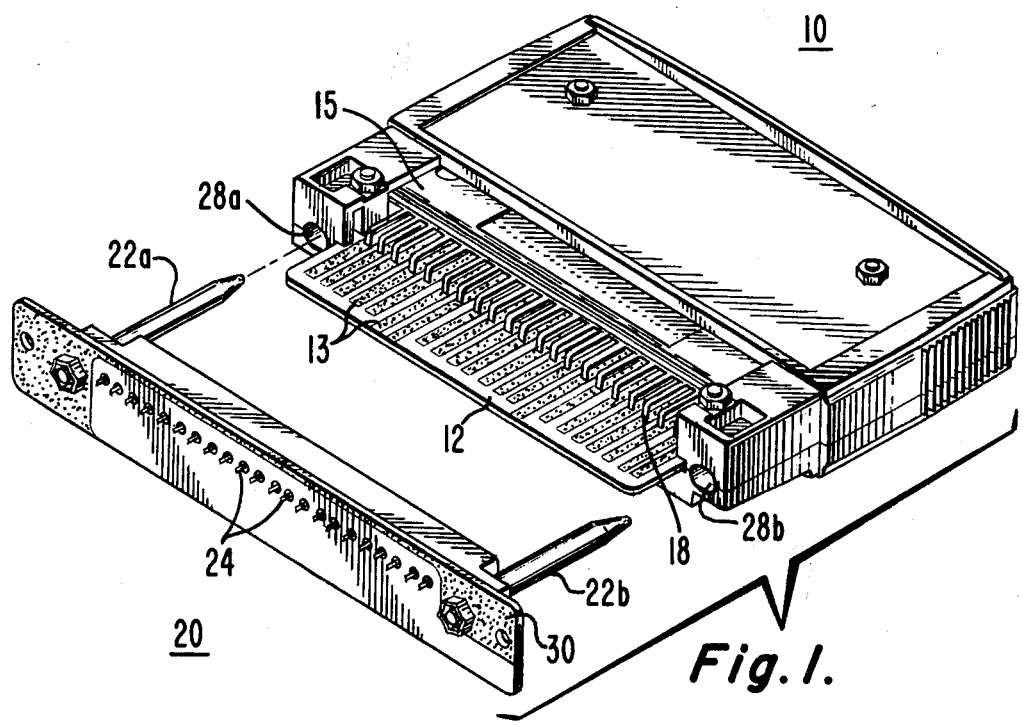
FIG. 1 is a pictorial representation of a connector assembly and a cartridge including a charge protection device according to the present invention.

In FIG. 1, a cartridge 10 fabricated of plastic or similar material encloses a printed circuit board 12 having a plurality of exposed elongated conductive contacts 13 disposed thereon. Each of these contacts is connected to a corresponding circuit terminal (i.e., of an integrated circuit) which is arranged on board 12 internal to cartridge 10. A protection device 15 fabricated from a single piece of metallic spring material (e.g., stainless steel) is mounted on circuit board 12 within cartridge 10. A portion of protection device 15 consists of a plurality of elongated conductive fingers 18 corresponding to the number of contacts 13.

A connector 20 includes a plurality of terminals 24 corresponding to the number of contacts 13 of cartridge 10. Each terminal has an associated mating receptacle (not shown) on the opposite side of connector 20 (i.e., facing contacts 13) for receiving the corresponding contact of cartridge 10 when the cartridge and connector are mated. Connector 20 also includes a pair of metallic actuator pins 22a and 22b for engaging a portion of protection device 15 within cartridge 10, when the cartridge 10 and connector 20 are mated via receptacles 28a and 28b, as will be discussed. The actuator pins contact a metallized area 30, which in this case serves as an area of ground potential when connector 20 is mounted on a suitable control unit (not shown). Pins 22a and 22b also assist to align connector 20 and cartridge 10 when being mated.

When connector 20 is mounted on a suitable control unit, terminals 24 of connector 20 are coupled to appropriate circuits within the control unit. These circuits are designed to cooperate with the circuits contained within cartridge 10 to allow the control unit, and any associated apparatus, to operate in desired fashion. The circuits within the control unit can also be of a type susceptible of damage due to excessive electrostatic charge.

When, as shown in FIG. 1, cartridge 10 is not connected to connector 20, fingers 18 of protection device 15 conductively engage associated contacts 13 of circuit board 12, thereby connecting together (i.e., shorting) these contacts and the associated terminals of the (integrated) circuit on board 12 in a manner which serves to protect the circuit from potential damage due to excessive electrostatic charge.

Figure 2:
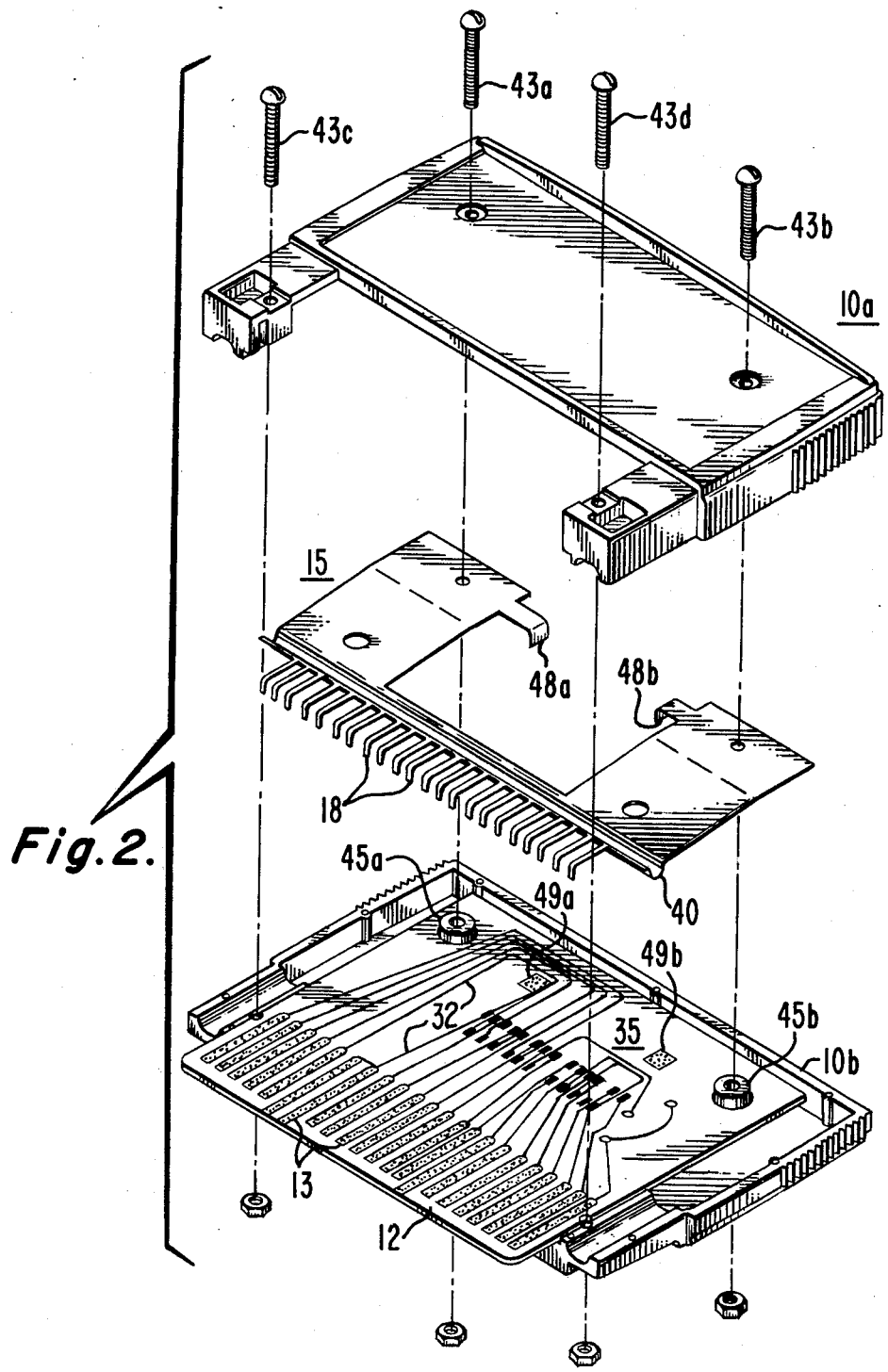
FIG. 2 depicts an exploded view of the cartridge shown in FIG. 1.

The internal arrangement of cartridge 10 is better seen from the exploded view of FIG. 2.

In FIG. 2, circuit board 12 is mounted within a lower half 10b of cartridge 10, which also includes an upper half 10a. The circuit board contains a conductive metallized pattern 32 disposed thereon for conductively coupling each of contacts 13 with associated circuit terminals 35, which in this case are arranged to receive the external terminals of an integrated circuit device.

Upper and lower halves 10a and 10b comprise a housing assembly, or cartridge. When these halves are mated together, receptacles 28a and 28b (see FIG. 1) are defined, and an aperture is defined through which the edge of board 12 with contact areas 13 is exposed externally. The assembly is secured by four screws 43a–43d arranged as shown. With these screws in place, protection device 15 is secured to the lower cartridge half 10b via screws 43a and 43b and associated spacers 45a and 45b, and an end remote from the end containing fingers 18. Portions 48a and 48b of device 15 respectively contact conductive pads 49a and 49b of board 12 when the housing assembly is secured.

Protection device 15 including the plurality of fingers 18 is arranged above circuit board 12 such that each of fingers 18 is arranged above associated contact areas 13. Device 15 also includes a protuberant region 40 extending in a direction to contact actuator pins 22a and 22b of connector 20 when cartridge 10 and connector 20 are mated. Device 15 is resilient and biased so that fingers 18 contact associated contact areas 13 when the housing assembly is secured, but so that fingers 18 can be disengaged from contact areas 13 when a sufficient force is applied to protuberance 40 in an upward direction (i.e., away from contact areas 13). This force is applied via actuator pins 22a and 22b (See FIG. 1).

Region 40 is shown as extending along the length of device 15. However, region 40 may also comprise dimpled regions situated and extending in a direction so as to engage pins 22a and 22b when connector 20 and cartridge 10 are mated. Top and side profile views of protection device 15 are shown in FIGS. 4a and 4b, respectively.

During the initial phase of mating cartridge 10 with connector 20, initial contact is made between protuberant region 40 of device 15 and the beveled tips of actuator pins 22a and 22b. Conductive pins 22a and 22b contact conductive area 30 of connector 20, and therefore contact the electrical ground on the control unit on which connector 20 mounts. Therefore device 15 with fingers 18, and consequently contact areas 13 and terminals 35, also contact the electrical ground. This action equalizes the electrostatic potential between board 12 and the control unit in a manner which prevents the circuits within the control unit and cartridge 10 from being damaged by excessive electrostatic charge.

Device 15 and pins 22a and 22b are configured such that as cartridge 10 is inserted further into connector 20, pins 22a and 22b further engage region 40 of device 15 such that the portion of device 15 including fingers 18 and region 40 are forced in an upward direction, away from contact areas 13 of board 12. Fingers 18 of device 15 are therefore lifted off contact areas 13 of board 12, thereby permitting the circuit within cartridge 10 to operate in desired fashion. During the next and final phase of insertion, contacts 13 of cartridge 10 connect with the associated receptacles and terminals 24 of connector 20, whereby the circuits within cartridge 10 and the control unit are coupled together. FIG. 3 illustrates a cut-away side view of a portion of cartridge 10 and connector 20 when mated, showing fingers 18 raised above the associated contact areas of board 12.

The reverse sequence of that described above automatically occurs when cartridge 10 is withdrawn from connector 20. In this instance, circuit terminals 35 remain protected (i.e., shorted) as discussed above.

What is claimed is:

1. Cartridge apparatus, for use with a connector assembly including an actuator device, comprising:

a housing defining a receptacle for receiving said actuator device and an aperture, along a wall of said housing;

a rigid member secured within said housing;

an electrical circuit mounted on said rigid member, said electrical circuit including a plurality of mutually spaced conductive contact areas disposed along an edge of said rigid member and exposed through said aperture; and a conductive member having an actuator contact region, and also including a plurality of mutually spaced conductive elements disposed along an edge of said conductive member and electrically connected in common to said actuator contact region, said conductive member being pivotally mounted within said housing for motion between (1) a first position in which (a) said conductive elements respectively conductively engage said contact areas, and (b) said actuator contact region is disposed within said receptacle in the path of travel of an actuator device to a seated position in said receptacle and (2) a second position in which said conductive elements are disengaged from said contact areas; said conductive member being subject to occupancy of said first position when said receptacle is unoccupied, and subject to displacement from said first position to said second position in response to displacement of said contact region from said path by an actuator device travelling to said seated position.

2. Apparatus according to claim 1, wherein:

said rigid member comprises a printed circuit board, and said electrical circuit comprises a metallization pattern disposed thereon; and said conductive member comprises a resilient member including elongated conductive strips corresponding to said conductive elements.

3. Apparatus comprising:

1. a connector assembly comprising
   a plurality of conductive terminals, and an actuator device coupled to a point of reference potential; and 2. a cartridge comprising
   a housing defining a receptacle for receiving said actuator device and an aperture, along a wall of said housing;

a rigid member secured within said housing;

an electrical circuit mounted on said rigid member, said electrical circuit including a plurality of mutually spaced conductive areas disposed along an edge of said rigid member and exposed through said aperture; and a conductive member having an actuator contact region, and also including a plurality of mutually spaced conductive elements disposed along an edge of said conductive member and electrically connected in common to said actuator contact region; said conductive member being pivotally mounted within said housing for motion between (1) a first position in which (a) said conductive elements respectively conductively engage said contact areas, and (b) said actuator contact region is disposed within said receptacle in the path of travel of said actuator device to a seated position in said receptacle and (2) a second position in which said conductive elements are disengaged from said contact areas; said conductive member occupying said first position when said receptacle is unoccupied, and being displaced from said first position to said second position in response to displacement of said contact region from said path by said actuator device travelling to said seated position, said connector terminals respectively contacting said contact areas when said actuator device is in said seated position; and wherein said conductive elements are coupled to said reference potential when said actuator device initially engages said actuator contact region prior to said conductive member being displaced from said first position.

4. Apparatus according to claim 3, wherein:

said actuator device comprises a conductive pin.

5. Apparatus according to claim 3, wherein:

said housing defines a pair of actuator receptacles along said wall; and said actuator device comprises a pair of conductive pins connected to said point of reference potential.

* * * * *